US007009547B2

(12) United States Patent
Guo et al.

(10) Patent No.: US 7,009,547 B2
(45) Date of Patent: Mar. 7, 2006

(54) CURRENT STEERING FOLDING CIRCUIT

(75) Inventors: Weidong Guo, Orangevale, CA (US); Robert J. Huber, Bountiful, UT (US); Kent F. Smith, Jacksonville, FL (US)

(73) Assignee: University of Utah Research Foundation, Salt Lake City, UT (US)

( * ) Notice: Subject to any disclaimer, the term of this patent is extended or adjusted under 35 U.S.C. 154(b) by 253 days.

(21) Appl. No.: 10/322,341

(22) Filed: Dec. 17, 2002

(65) Prior Publication Data

US 2003/0143795 A1 Jul. 31, 2003

Related U.S. Application Data

(60) Provisional application No. 60/341,334, filed on Dec. 17, 2001.

(51) Int. Cl.
H03M 1/12 (2006.01)
(52) U.S. Cl. ...................................... 341/156; 341/155
(58) Field of Classification Search ................ 341/155, 341/156, 136, 161, 118, 159
See application file for complete search history.

(56) References Cited

U.S. PATENT DOCUMENTS

| 5,309,157 | A | | 5/1994 | Yee | 341/156 |
|---|---|---|---|---|---|
| 5,319,372 | A | | 6/1994 | Yee | 341/156 |
| 5,324,995 | A | | 6/1994 | Yee | 307/352 |
| 5,341,137 | A | | 8/1994 | Yee | 341/156 |
| 5,367,202 | A | | 11/1994 | Yee | 327/540 |
| 5,376,937 | A | * | 12/1994 | Colleran et al. | 341/159 |
| 5,392,045 | A | | 2/1995 | Yee | 341/156 |
| 5,633,638 | A | * | 5/1997 | Venes et al. | 341/155 |
| 5,640,163 | A | * | 6/1997 | Nauta et al. | 341/155 |
| 5,973,540 | A | | 10/1999 | Boisvert | 327/362 |
| 6,157,257 | A | * | 12/2000 | Murphy | 330/252 |
| 6,172,636 | B1 | | 1/2001 | Murden et al. | 341/155 |
| 6,175,323 | B1 | * | 1/2001 | Flynn | 341/156 |
| 6,304,201 | B1 | | 10/2001 | Moreland et al. | 341/54 |
| 6,411,246 | B1 | * | 6/2002 | Nagaraj | 341/158 |
| 6,480,133 | B1 | * | 11/2002 | Kobayashi et al. | 341/156 |

FOREIGN PATENT DOCUMENTS

WO    WO0062419    10/2000

OTHER PUBLICATIONS

Rob E.J. Van De Grift et al., An 8-Bit Video ADC Incorporating Folding and Interpolation Techniques, IEEE Journal of Solid-State Circuit, vol. SC-22, No. 6, pp. 944-953, Dec. 1987.

Yun Chiu et al., A Study of Folding and Interpolating ADC, EECS247, pp. 1-6, Fall 2000, no month.

* cited by examiner

Primary Examiner—John B Nguyen
(74) Attorney, Agent, or Firm—Madson & Metcalf

(57) ABSTRACT

A current steering folding circuit is provided. The current steering folding circuit includes a load and at least one current source for drawing a current from the load. The current steering folding circuit also includes a first output signal terminal for providing a first output signal, and a second output signal terminal for providing a second output signal. A current steering section is also provided. The current steering section steers the current between the first output signal terminal and the second output signal terminal based on an input signal. The first output signal is substantially equal to the second output signal for N values of the input signal. Advantageously, the number of current sources does not exceed N.

38 Claims, 6 Drawing Sheets

CURRENT STEERING FOLDING CIRCUIT

RELATED APPLICATIONS

This application is related to and claims priority from U.S. Provisional Patent Application Ser. No. 60/341,334 filed Dec. 17, 2001, for "A Current Steering Folding Circuit," with inventors Weidong Guo, Robert J. Huber, and Kent F. Smith, which is incorporated herein by reference.

BACKGROUND OF THE INVENTION

1. Field of the Invention

The present invention relates generally to electronic circuits. More specifically, the present invention relates to a current steering folding circuit which may be used in an analog-to-digital converter (ADC).

2. Description of Related Art

The rapid expansion of digital signal processing across large and diverse sets of applications has made the ADC an important functional building block in most analog/digital very large-scale integration (VLSI) systems. Applications such as wireless communications, flat-panel displays and hand-held multimedia devices require highspeed ADCs with low power dissipation.

Several types of ADCs are known in the art. For example, a "flash" ADC utilizes a set of comparators operating in parallel, each comparing the analog input signal to a different reference voltage. The flash ADC is one of the fastest presently-known ADC architectures. However, the exponential growth of power, area and input capacitance of flash ADCs as a function of resolution makes them impractical for resolution above 8 bits.

Another type of ADC utilizes a "folding" circuit. In such an ADC, an analog input signal is applied to a coarse quantizer and a folding circuit. The coarse quantizer determines the most significant bits of the digital output signal. The folding circuit linearly "folds" the analog input signal to provide a folded output signal. The range of the folded output signal is smaller than the range of the analog input signal. The folded output signal is then provided to a fine quantizer. The fine quantizer determines the least significant bits of the digital output signal.

Typically, the folded output signal is proportional to the difference between two signals that have a plurality of zero crossing points (i.e., points where the signals are equal) when measured against an increasing input signal. The number of periodic piece-wise linear segments, or folds, in the input-output transfer characteristics of the folding circuit corresponds to the number of zero crossing points and is referred to as the folding factor of the circuit.

In a conventional folding circuit, N+1 current sources are required for a folding circuit with a folding factor of N. There are several drawbacks associated with this approach. First, mismatches in the current sources may cause output offset errors at the zero crossing points. Second, the use of N+1 current sources causes excessive capacitive loading at the output of the folding circuit, which limits the sampling frequency of the fine quantizer. Finally, the use of N+1 current sources requires a great deal of power.

Accordingly, it would be an advancement in the art if means were provided to overcome one or more of the above problems.

SUMMARY OF THE INVENTION

The apparatus of the present invention has been developed in response to the present state of the art, and in particular, in response to the problems and needs in the art that have not yet been fully solved by currently available folding circuits. In accordance with the invention as embodied and broadly described herein, a current steering folding circuit is provided. The current steering folding circuit includes a load and at least one current source for drawing a current from the load. The current steering folding circuit also includes a first output signal terminal for providing a first output signal, and a second output signal terminal for providing a second output signal. A current steering section is also provided. The current steering section steers the current between the first output signal terminal and the second output signal terminal based on an input signal. The first output signal is substantially equal to the second output signal for N values of the input signal. Advantageously, the number of current sources does not exceed N.

The current steering folding circuit may also include a plurality of reference signal terminals. Each reference signal terminal receives a different reference signal from a plurality of reference signals. The N values of the input signal may correspond to the plurality of reference signals.

The current steering section may include a plurality of differential pairs. Each differential pair may include a first transistor and a second transistor. The first transistor in each differential pair is coupled to the input terminal, and the second transistor in each differential pair is coupled to one of the plurality of reference signal terminals. The plurality of differential pairs may be serially connected. The number of differential pairs may be equal to N.

The load may include a first load transistor and a second load transistor. The first output signal may be a first load transistor current through the first load transistor, and the second output signal may be a second load transistor current through the second load transistor.

The current steering folding circuit may be used to provide a folded output signal in an analog-to-digital converter. The folded output signal may be proportional to the difference between the first output signal and the second output signal.

An analog-to-digital converter (ADC) for converting an analog input signal into a digital output signal is also disclosed. The ADC includes a coarse quantizer for receiving the analog input signal and determining the most significant bits of the digital output signal. The ADC also includes a fine quantizer for receiving a folded output signal and determining the least significant bits of the digital output signal. The ADC also includes a current steering folding circuit for receiving the analog input signal and generating the folded output signal.

These and other features and advantages of the present invention will become more fully apparent from the following description and appended claims, or may be learned by the practice of the invention as set forth hereinafter.

BRIEF DESCRIPTION OF THE DRAWINGS

In order that the manner in which the above-recited and other features and advantages of the invention are obtained will be readily understood, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION

It will be readily understood that the components of the embodiments as generally described and illustrated in the Figures herein could be arranged and designed in a wide variety of different configurations. Thus, the following more detailed description of certain exemplary embodiments of the present invention is not intended to limit the scope of the invention, as claimed, but is merely representative of the embodiments of the invention.

The word "exemplary" is used exclusively herein to mean "serving as an example, instance, or illustration." Any embodiment described herein as "exemplary" is not necessarily to be construed as preferred or advantageous over other embodiments.

Figure 1:
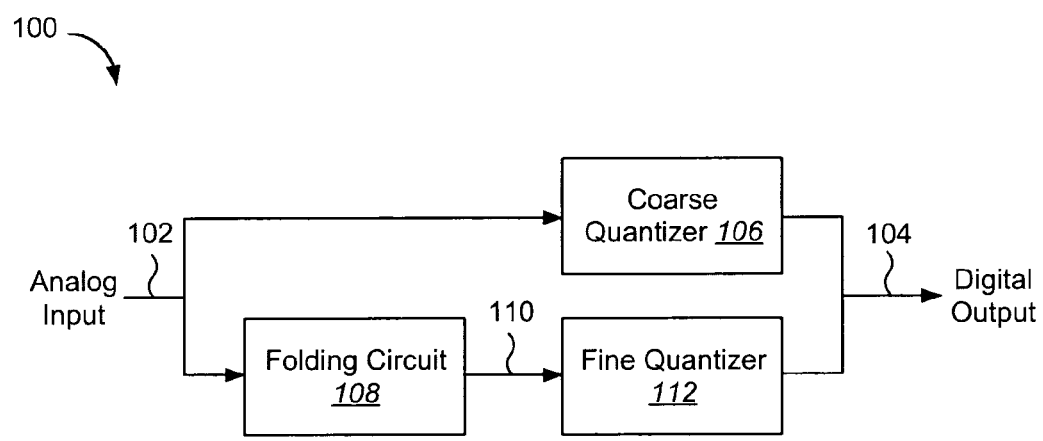
FIG. 1 is a functional block diagram of an analog-to-digital converter.

FIG. 1 is a functional block diagram of an analog-to-digital converter (ADC) 100. The ADC 100 converts an analog input signal 102 to a digital output signal 104. The ADC 100 includes a coarse quantizer 106. The analog input signal 102 is provided to the coarse quantizer 106. The coarse quantizer 106 determines the most significant bits of the digital output signal 104. The analog input signal 102 is also provided to a current steering folding circuit 108. The current steering folding circuit 108 linearly "folds" the analog input signal 102 to provide a folded output signal 110. The range of the folded output signal 110 is smaller than the range of the analog input signal 102. Additional details about the folded output signal 110 will be provided in connection with FIG. 2. The folded output signal 110 is then provided to a fine quantizer 112. The fine quantizer 112 determines the least significant bits of the digital output signal 104.

Figure 2:
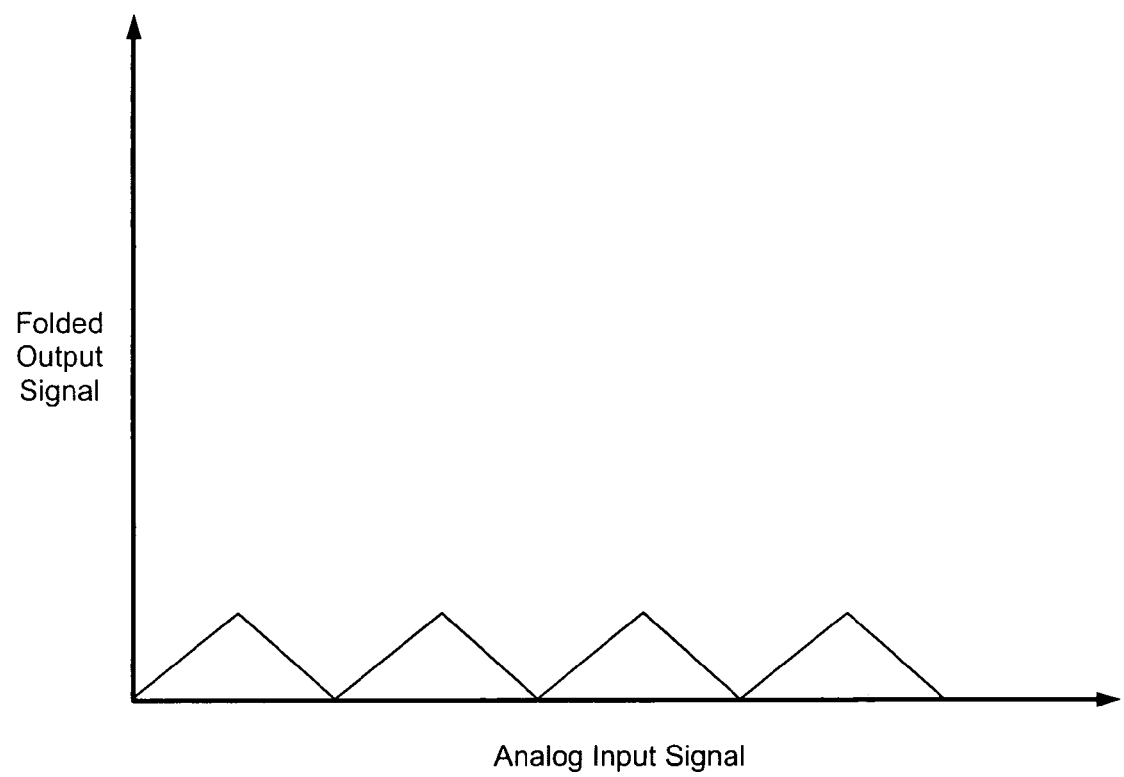
FIG. 2 is a graph illustrating an ideal folded output signal of the current steering folding circuit measured against an increasing analog input signal.

FIG. 2 is a graph illustrating an ideal folded output signal 110 of the current steering folding circuit 108 measured against an increasing analog input signal 102. As shown, the current steering folding circuit 108 linearly folds the analog input signal 102, i.e., maps the analog input signal 102 in a modulo remainder fashion to a smaller range. The number of periodic piece-wise linear segments, or folds, in the input-output transfer characteristics of the current steering folding circuit 108 is referred to as the folding factor of the circuit 108. The current steering folding circuit 108 whose transfer function is shown in FIG. 2 has a folding factor of 8.

Figure 3:
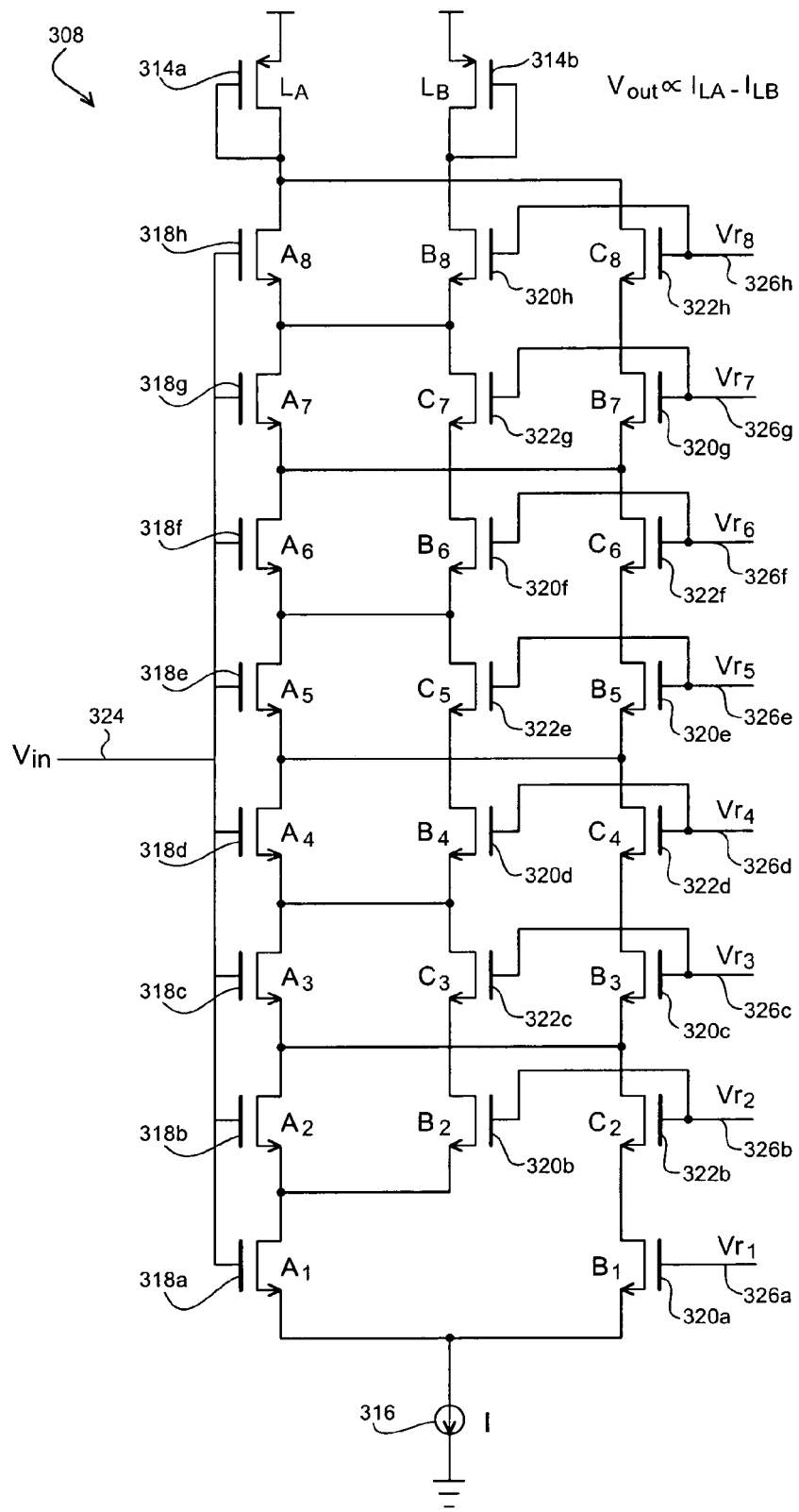
FIG. 3 is a schematic diagram of an embodiment of the current steering folding circuit.

FIG. 3 is a schematic diagram of an embodiment of a current steering folding circuit 308. The current steering folding circuit 308 includes a pair of load transistors $L_A$ 314a and $L_B$ 314b. The current steering folding circuit 308 also includes a current source 316. The current source 316 draws a current I from load transistors $L_A$ 314a and $L_B$ 314b. The folded output signal 110 of the current steering folding circuit 308 is proportional to the difference between the current $I_{LA}$ through load transistor $L_A$ 314a and the current $I_{LB}$ through load transistor $L_B$ 314b.

The current steering folding circuit 308 includes eight serially connected differential pairs $A_i$ 318 and $B_i$ 320 disposed between the load transistors $L_A$ 314a and $L_B$ 314b and the current source 316. A differential pair refers to two transistors that are connected in such a way that the difference in voltage applied to the transistors controls the current flow through the transistors. In the embodiment shown in FIG. 3, the transistors $A_i$ 318 and $B_i$ 320 are n-type MOSFETs whose sources are connected together. Therefore, when the voltage applied to the gate of transistor $A_i$ 318 exceeds the voltage applied to the gate of transistor $B_i$ 320, the current through transistor $A_i$ 318 exceeds the current through transistor $B_i$ 320. When the voltage applied to the gate of transistor $A_i$ 318 is substantially equal to the voltage applied to the gate of transistor $B_i$ 320, the current through transistor $A_i$ 318 is substantially equal to the current through transistor $B_i$ 320. When the voltage applied to the gate of transistor $B_i$ 320 exceeds the voltage applied to the gate of transistor $A_i$ 318, the current through transistor $B_i$ 320 exceeds the current through transistor $A_i$ 318.

The gate of transistor $A_i$ 318 in each differential pair is coupled to an input terminal 324 for receiving the analog input signal 102. The gate of transistor $B_i$ 320 in each differential pair is coupled to a different reference signal terminal 326 for receiving one of eight different reference signals. In the embodiment shown in FIG. 3, the analog input signal 102 is an input voltage $V_{in}$, and the different reference signals are reference voltages $V_{ri}$. The reference voltages $V_{ri}$ progressively increase for each successive differential pair. That is, $V_{r1}<V_{r2}$, $V_{r2}<V_{r3}$, and so forth. Because transistors $A_i$ 318 and $B_i$ 320 are connected together as a differential pair, the voltage applied to the gates of the transistors controls the current flow through the transistors. Therefore, if $V_{in}>V_{ri}$, the current through transistor $A_i$ 318 exceeds the current through transistor $B_i$ 320. If $V_{in}=V_{ri}$, the current through transistor $A_i$ 318 is substantially equal to the current through transistor $B_i$ 320. If $V_{in}<V_{ri}$, the current through transistor $B_i$ 320 exceeds the current through transistor $A_i$ 318.

A transistor $C_i$ 322 is provided for each differential pair $A_i$ 318 and $B_i$ 320, except the differential pair that is directly connected to the current source 316. Transistor $C_i$ 322 provides a signal path for the current flowing through transistor $B_{i-1}$ 320. In the embodiment shown in FIG. 3, the transistors $C_i$ 322 are n-type MOSFETs. The gate of transistor $C_i$ 322 is connected to one of the reference voltages $V_{ri}$. The drain of transistor $C_i$ 322 is connected to the drain of transistor $A_i$ 318. The source of transistor $C_i$ 322 is connected to the drain of transistor $B_{i-1}$ 320.

As will be discussed in greater detail below, the portion of the current steering folding circuit 308 between the load transistors 314a, 314b and the current source 316 can be thought of as a "current steering" section. The current steering section steers the current I between the first load transistor $L_A$ 314a and the second load transistor $L_B$ 314b based on the input voltage $V_{in}$.

As will also be discussed in greater detail below, the current steering folding circuit 308 shown in FIG. 3 has a folding factor of 8. Advantageously, the current steering folding circuit 308 only includes a single current source 316. As described previously, a conventional folding circuit with a folding factor of N requires N+1 current sources. Because the current steering folding circuit 308 shown in FIG. 3 requires fewer current sources 308 than the conventional folding circuit, the current steering folding circuit 308 may occupy less chip area and consume less power than the conventional folding circuit. In addition, because the differential pairs $A_i$ 318 and $B_i$ 320 are serially connected, the current steering folding circuit 308 shown in FIG. 3 may possess a lower output capacitance than the conventional folding circuit.

In the current steering folding circuit 108 shown in FIG. 3, the load transistors $L_A$ 314a and $L_B$ 314b are p-type MOSFETs, and transistors $A_i$ 318, $B_i$ 320, and $C_i$ 322 are n-type MOSFETs. However, in alternative embodiments, other types of transistors may be used. For example, any type of field effect transistor (e.g., MOSFETs, MESFETs, and JFETs, either n-type or p-type) or any type of bipolar junction transistor (e.g., npn or pnp) may be used.

Figure 4:
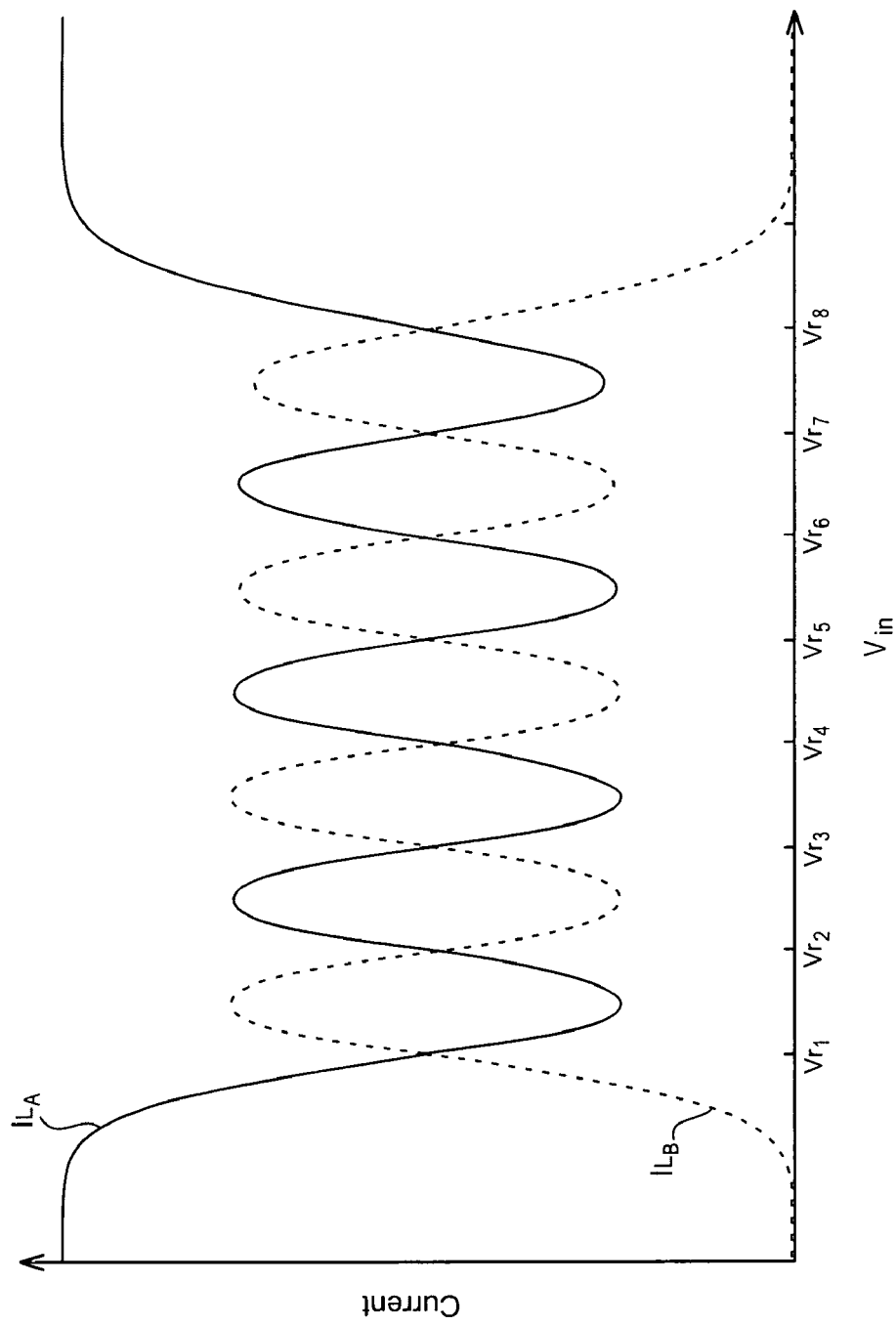
FIG. 4 is a graph of the current through the load transistors measured as a function of the input voltage.

FIG. 4 is a graph of the current $I_{LA}$ through the load transistor $L_A$ 314a and the current $I_{LB}$ through the load transistor $L_B$ 314b measured as a function of the input voltage $V_{in}$. As stated previously, the folded output signal 110 of the current steering folding circuit 308 is proportional to the difference between the current $I_{LA}$ through load transistor $L_A$ 314a and the current $I_{LB}$ through load transistor $L_B$ 314b.

When $V_{in}<<V_{r1}$ transistors $A_1$ 318a through $A_8$ 318h are off, and transistors $B_1$ 320a through $B_8$ 320h and $C_2$ 322b through $C_8$ 322h are on. Because transistor $A_1$ 318a is off, the current through transistor $A_1$ 318a is zero, and the current through transistor $B_1$ 320a is I. At this point, the current $I_{LA}$ through load transistor $L_A$ 314a equals the current through transistor $B_1$ 320a. Therefore, $I_{LA}=I$ and $I_{LB}=0$, as shown in FIG. 4.

When $V_{in}=V_{r1}$, transistor $A_1$ 318a has turned on. Transistors $A_1$ 318a and $B_1$ 320a share the current I equally. The current $I_{LA}$ through load transistor $L_A$ 314a equals the current through transistor $B_1$ 320a, and the current $I_{LB}$ through load transistor $L_B$ 314b equals the current through transistor $A_1$ 318a. Therefore, $I_{LA}=I_{LB}$, as shown in FIG. 4.

When $V_{r1}<V_{in}<V_{r2}$, transistor $A_2$ 318b has started to turn on, and transistor $B_1$ 320a has started to turn off. The current $I_{LB}$ through transistor $L_B$ 314b equals the current through transistor $B_2$ 320b. The current $I_{LA}$ through transistor $L_A$ 314a equals the current through transistor $A_2$ 318b plus the current through transistor $B_1$ 320a. The current through transistor $B_2$ 320b exceeds the current through transistor $A_2$ 318b, and the current through transistor $B_1$ 320a is negligible. Therefore, $I_{LB}>I_{LA}$, as shown in FIG. 4.

When $V_{in}=V_{r2}$, transistor $A_2$ 318b has turned on, and transistor $B_1$ 320a has turned off. Transistors $A_2$ 318b and $B_2$ 320b share the current I equally. The current $I_{LA}$ through load transistor $L_A$ 314a equals the current through transistor $A_2$ 318b, and the current $I_{LB}$ through load transistor $L_B$ 314b equals the current through transistor $B_2$ 320b. Therefore, $I_{LA}=I_{LB}$, as shown in FIG. 4.

When $V_{r2}<V_{in}<V_{r3}$, transistor $A_3$ 318c has started to turn on, and transistor $B_2$ 320b has started to turn off. The current $I_{LA}$ through transistor $L_A$ 314a equals the current through transistor $A_2$ 318b. The current $I_{LB}$ through transistor $L_B$ 314b equals the current through transistor $A_3$ 318c plus the current through transistor $B_2$ 320b. The current through transistor $A_2$ 318b exceeds the current through transistor $B_2$ 320b, and the current through transistor $A_3$ 318c is negligible. Therefore, $I_{LA}>I_{LB}$, as shown in FIG. 4.

When $V_{in}=V_{r3}$, transistor $A_3$ 318c has turned on, and transistor $B_2$ 320b has turned off. Transistors $A_3$ 318c and $B_3$ 320c share the current I equally. The current $I_{LA}$ through load transistor $L_A$ 314a equals the current through transistor $B_3$ 320c, and the current $I_{LB}$ through load transistor $L_B$ 314b equals the current through transistor $A_3$ 318c. Therefore, $I_{LA}=I_{LB}$, as shown in FIG. 4.

When $V_{r3}<V_{in}<V_{r4}$, transistor $A_4$ 318d has started to turn on, and transistor $B_3$ 320c has started to turn off. The current $I_{LB}$ through transistor $L_B$ 314b equals the current through transistor $A_3$ 318c. The current $I_{LA}$ through transistor $L_A$ 314a equals the current through transistor $A_4$ 318d plus the current through transistor $B_3$ 320c. The current through transistor $A_3$ 318c exceeds the current through transistor $B_3$ 320c, and the current through transistor $A_4$ 318d is negligible. Therefore, $I_{LB}>I_{LA}$, as shown in FIG. 4.

When $V_{in}=V_{r4}$, transistor $A_4$ 318d has turned on, and transistor $B_3$ 320c has turned off. Transistors $A_4$ 318d and $B_4$ 320d share the current I equally. The current $I_{LA}$ through load transistor $L_A$ 314a equals the current through transistor $A_4$ 318d, and the current $I_{LB}$ through load transistor $L_B$ 314b equals the current through transistor $B_4$ 320d. Therefore, $I_{LA}=I_{LB}$, as shown in FIG. 4.

When $V_{r4}<V_{in}<V_{r5}$, transistor $A_5$ 318e has started to turn on, and transistor $B_4$ 320d has started to turn off. The current $I_{LA}$ through transistor $L_A$ 314a equals the current through transistor $A_4$ 318d. The current $I_{LB}$ 314b through transistor $L_B$ 314b equals the current through transistor $A_5$ 318e plus the current through transistor $B_4$ 320d. The current through transistor $A_4$ 318d exceeds the current through transistor $B_4$ 320d, and the current through transistor $A_5$ 318e is negligible. Therefore, $I_{LA}>I_{LB}$, as shown in FIG. 4.

When $V_{in}=V_{r5}$, transistor $A_5$ 318e has turned on, and transistor $B_4$ 320d has turned off. Transistors $A_5$ 318e and $B_5$ 320e share the current I equally. The current $I_{LA}$ through load transistor $L_A$ 314a equals the current through transistor $B_5$ 320e, and the current $I_{LB}$ through load transistor $L_B$ 314b equals the current through transistor $A_5$ 318e. Therefore, $I_{LA}=I_{LB}$, as shown in FIG. 4.

When $V_{r5}<V_{in}<V_{r6}$, transistor $A_6$ 318f has started to turn on, and transistor $B_5$ 320e has started to turn off. The current $I_{LB}$ through transistor $L_B$ 314b equals the current through transistor $A_5$ 318e. The current $I_{LA}$ through transistor $L_A$ 314a equals the current through transistor $A_6$ 318f plus the current through transistor $B_5$ 320e. The current through transistor $A_5$ 318e exceeds the current through transistor $B_5$ 320e, and the current through transistor $A_6$ 318f is negligible. Therefore, $I_{LB}>I_{LA}$, as shown in FIG. 4.

When $V_{in}=V_{r6}$, transistor $A_6$ 318f has turned on, and transistor $B_5$ 320e has turned off. Transistors $A_6$ 318f and $B_6$ 320f share the current I equally. The current $I_{LA}$ through load transistor $L_A$ 314a equals the current through transistor $A_6$ 318f, and the current $I_{LB}$ through load transistor $L_B$ 314b equals the current through transistor $B_6$ 320f. Therefore, $I_{LA}=I_{LB}$, as shown in FIG. 4.

When $V_{r6}<V_{in}<V_{r7}$, transistor $A_7$ 318g has started to turn on, and transistor $B_6$ 320f has started to turn off. The current $I_{LA}$ through transistor $L_A$ 314a equals the current through transistor $A_6$ 318f. The current $I_{LB}$ through transistor $L_B$ 314b equals the current through transistor $A_7$ 318g plus the current through transistor $B_6$ 320f. The current through transistor $A_6$ 318f exceeds the current through transistor $B_6$ 320f, and the current through transistor $A_7$ 318g is negligible. Therefore, $I_{LA}>I_{LB}$, as shown in FIG. 4.

When $V_{in}=V_{r7}$, transistor $A_7$ 318g has turned on, and transistor $B_6$ 320f has turned off. Transistors $A_7$ 318g and $B_7$ 320g share the current I equally. The current $I_{LA}$ through load transistor $L_A$ 314a equals the current through transistor $B_7$ 320g, and the current $I_{LB}$ through load transistor $L_B$ 314b equals the current through transistor $A_7$ 318g. Therefore, $I_{LA}=I_{LB}$, as shown in FIG. 4.

When $V_{r7}<V_{in}<V_{r8}$, transistor $A_8$ 318h has started to turn on, and transistor $B_7$ 320g has started to turn off. The current $I_{LB}$ through transistor $L_B$ 314b equals the current through transistor $A_7$ 318g. The current $I_{LA}$ through transistor $L_A$ 314a equals the current through transistor $B_7$ 320g plus the current through transistor $A_8$ 318h. The current through transistor $A_7$ 318g exceeds the current through transistor $B_7$ 320g, and the current through transistor $A_8$ 318h is negligible. Therefore, $I_{LB}>I_{LA}$, as shown in FIG. 4.

When $V_{in}=V_{r8}$, transistor $A_8$ 318h has turned on, and transistor $B_7$ 320g has turned off. Transistors $A_8$ 318h and $B_8$ 320h share the current I equally. The current $I_{LA}$ through load transistor $L_A$ 314a equals the current through transistor $A_8$ 318h, and the current $I_{LB}$ through load transistor $L_B$ 314b equals the current through transistor $B_8$ 320h. Therefore, $I_{LA}=I_{LB}$, as shown in FIG. 4.

When $V_{in}>>V_{r8}$, transistors $A_1$ 318a through $A_8$ 318h are on, and transistors $B_1$ 320a through $B_8$ 320h and $C_2$ 322b through $C_8$ 322h are off. Because transistor $B_1$ 320a is off, the current through transistor $B_1$ 320a is zero, and the current through transistor $A_1$ 318a is I. At this point, the current $I_{LA}$ through load transistor $L_A$ 314a equals the current through transistor $A_1$ 318a. Therefore, $I_{LA}=I$ and $I_{LB}=0$, as shown in FIG. 4.

As is demonstrated by the above discussion, the current steering section steers the current I between the first load transistor $L_A$ 314a and the second load transistor $L_B$ 314b based on the input voltage $V_{in}$. When $V_{in}$ is equal to a reference signal $V_{ri}$, the current $I_{LA}$ through load transistor $L_A$ 314a is equal to the current $I_{LB}$ through load transistor $L_B$ 314b. For some values of $V_{in}$ that do not equal a reference signal $V_{ri}$, the current $I_{LA}$ through load transistor $L_A$ 314a is greater than the current $I_{LB}$ through load transistor $L_B$ 314b. For other values of $V_{in}$ that do not equal a reference signal $V_{ri}$ the current $I_{LA}$ through load transistor $L_A$ 314a is less than the current $I_{LB}$ through load transistor $L_B$ 314b.

The current $I_{LA}$ through load transistor $L_A$ 314a is equal to the current $I_{LB}$ through load transistor $L_B$ 314b for N values of $V_{in}$. The N values of $V_{in}$ correspond to the plurality of reference signals $V_{ri}$. That is, $I_{LA}=I_{LB}$ whenever $V_{in}=V_{ri}$. As described previously, the folding factor of the current steering folding circuit 308 is the number of periodic piece-wise linear segments, or folds, in the input-output transfer characteristics of the current steering folding circuit 308. The folding factor of the current steering folding circuit 308 shown and described in relation to FIGS. 3 and 4 is also equal to N.

In the current steering folding circuit 308 shown and described in relation to FIGS. 3 and 4, the analog input signal 102 is a voltage $V_{in}$, and the reference signals are reference voltages $V_{ri}$. Alternatively, the analog input signal 102 and/or the reference signals may be currents. In addition, in the above discussion, the folded output signal 110 is proportional to the difference between two currents, the current $I_{LA}$ through load transistor $L_A$ 314a and the current $I_{LB}$ through load transistor $L_B$ 314b. Alternatively, the folded output signal 110 may be proportional to the difference between two voltages.

Figure 5:
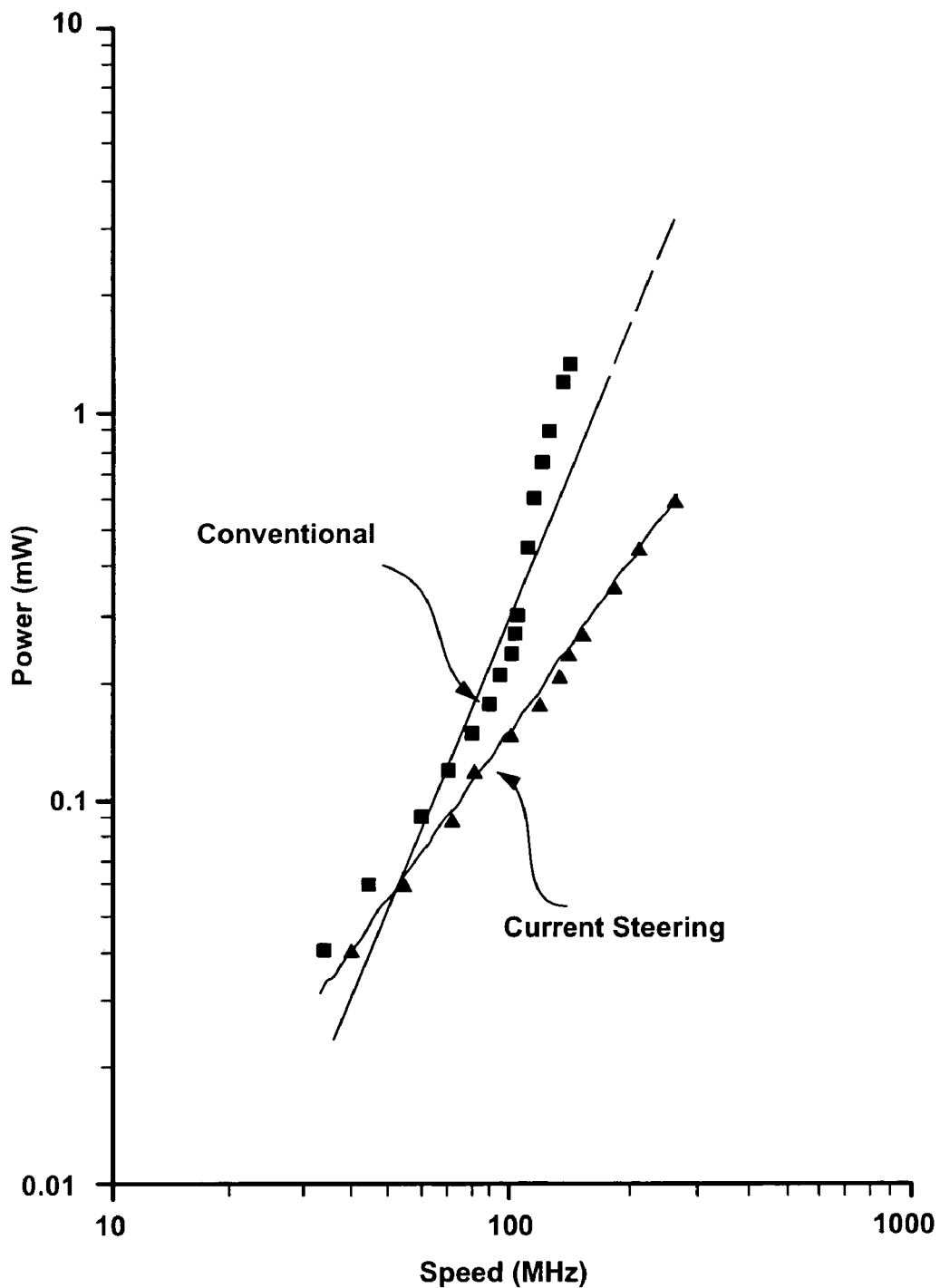
FIG. 5 shows the speed and power relationship of the current steering folding circuit shown in FIG. 3 and the conventional current steering folding circuit.

The current steering folding circuit 308 shown in FIG. 3 and a conventional folding circuit were designed and simulated with the same transistor size and the same current source in a 0.5 µm CMOS process. FIG. 5 shows the speed and power relationship of the current steering folding circuit 308 and the conventional folding circuit. As shown in FIG. 5, the current steering folding circuit 308 consumes less power than the conventional folding circuit for sampling rates above about 50 MHz.

As described previously, the current steering folding circuit 308 shown in FIG. 3 includes a single current source 316. In alternative embodiments, more than one current source may be used. In fact, in a current steering folding circuit 108 with a folding factor of N, as many as N current sources may be used.

Figure 6:
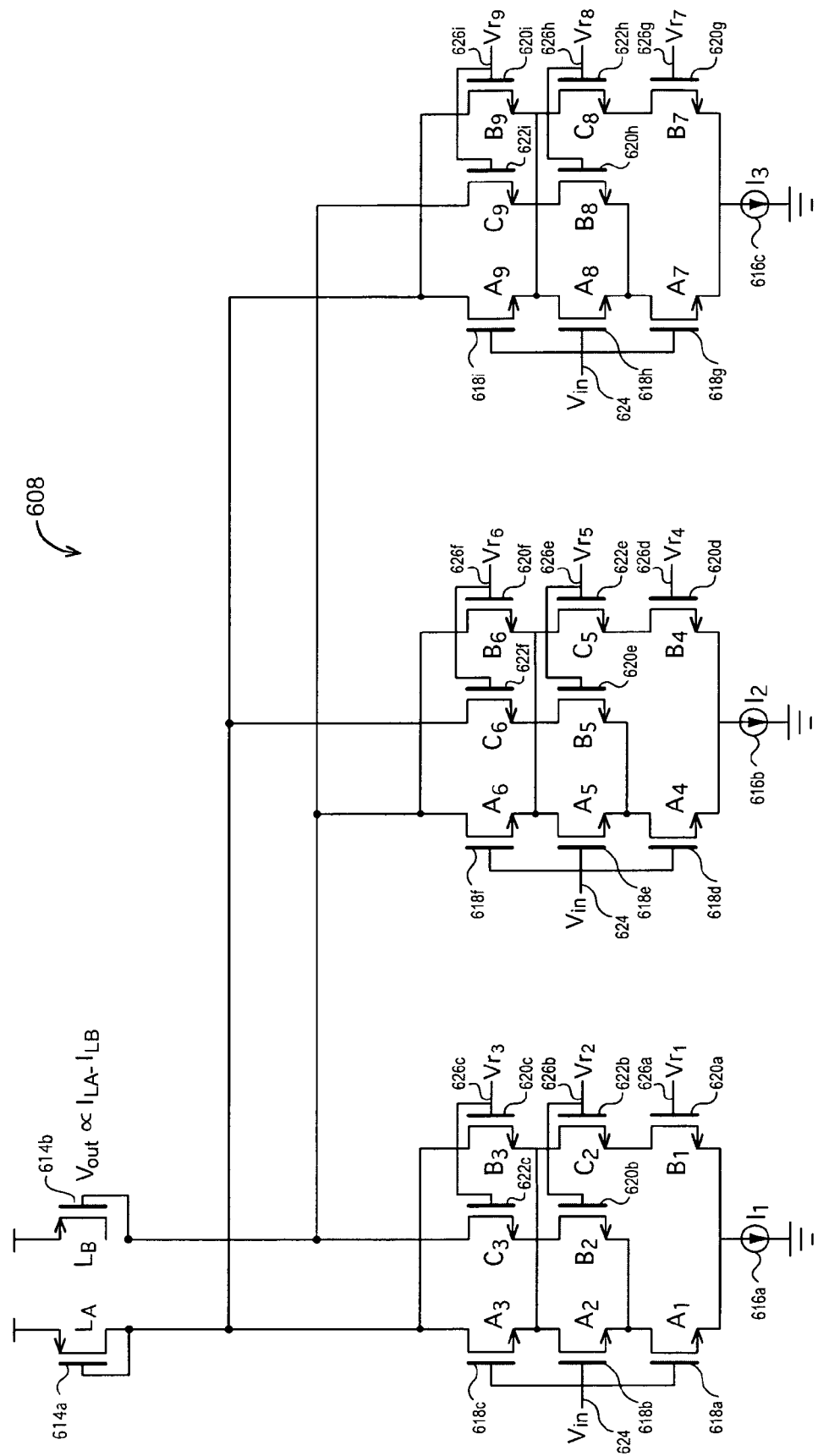
FIG. 6 is a schematic diagram of an alternative embodiment of a current steering folding circuit.

FIG. 6 is a schematic diagram of an alternative embodiment of a current steering folding circuit 608. The current steering folding circuit 608 includes a pair of load transistors $L_A$ 614a and $L_B$ 614b and three current sources 616a, 616b, 616c. A first current source 616a draws a current $I_1$ from the load transistors $L_A$ 614a and $L_B$ 614b, a second current source 616b draws a current $I_2$ from the load transistors $L_A$ 614a and $L_B$ 614b, and a third current source 608c draws a current $I_3$ from the load transistors $L_A$ 614a and $L_B$ 614b. As before, the folded output signal 110 of the current steering folding circuit 608 is proportional to the difference between the current $I_{LA}$ through load transistor $L_A$ 614a and the current $I_{LB}$ through load transistor $L_B$ 614b.

The current steering folding circuit 608 shown in FIG. 6 includes nine differential pairs. Three serially connected differential pairs $A_1$ 618a and $B_1$ 620a, $A_2$ 618b and $B_2$ 620b, and $A_3$ 618c and $B_3$ 620c are disposed between the load transistors $L_A$ 614a and $L_B$ 614b and the first current source 616a. Three serially connected differential pairs $A_4$ 618d and $B_4$ 620d, $A_5$ 618e and $B_5$ 620e, and $A_6$ 618f and $B_6$ 620f are disposed between the load transistors $L_A$ 614a and $L_B$ 614b and the second current source 616b. Three serially connected differential pairs $A_7$ 618g and $B_7$ 620g, $A_8$ 618h and $B_8$ 620h, and $A_9$ 618i and $B_9$ 620i are disposed between the load transistors $L_A$ 614a and $L_B$ 614b and the third current source 616c.

The gate of transistor $A_i$ 618 in each differential pair is coupled to an input terminal 624 for receiving the analog input signal 102. The gate of transistor $B_i$ 620 in each differential pair is coupled to a different reference signal terminal 626 for receiving one of eight different reference signals. As before, the analog input signal 102 is an input voltage $V_{in}$, and the different reference signals are reference voltages $V_{ri}$. The reference voltages $V_{ri}$ progressively increase for each successive differential pair. That is, $V_{r1}<V_{r2}$, $V_{r2}<V_{r3}$, and so forth. A transistor $C_i$ 622 is provided for each differential pair $A_i$ 618 and $B_i$ 620 that is not directly connected to a current source 616. As before, transistor $C_i$ 622 provides a signal path for the current flowing through transistor $B_{i-1}$ 620.

Further details regarding the operation of the current steering folding circuit 608 shown in FIG. 6 will be readily apparent to those skilled in the art in light of the above discussion regarding the current steering folding circuit 308 shown in FIG. 3.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A current steering folding circuit, comprising:
   an input terminal for receiving an input signal;
   a load;
   at least one current source for drawing a current from the load;
   a first output signal terminal for providing a first output signal;
   a second output signal terminal for providing a second output signal; and
   a current steering section for steering the current between the first output signal terminal and the second output signal terminal based on the input signal, wherein the first output signal is substantially equal to the second output signal for N values of the input signal, and wherein the number of current sources does not exceed N.

2. The current steering folding circuit as defined in claim 1, further comprising a plurality of reference signal terminals, wherein each reference signal terminal receives a different reference signal from a plurality of reference signals.

3. The current steering folding circuit as defined in claim 2, wherein the N values of the input signal correspond to the plurality of reference signals.

4. The current steering folding circuit as defined in claim 2, wherein the current steering section comprises a plurality of differential pairs.

5. The current steering folding circuit as defined in claim 4, wherein the plurality of differential pairs are serially connected.

6. The current steering folding circuit as defined in claim 4, wherein the number of differential pairs is equal to N.

7. The current steering folding circuit as defined in claim 4, wherein each differential pair comprises a first transistor and a second transistor, wherein the first transistor in each differential pair is coupled to the input terminal, and wherein the second transistor in each differential pair is coupled to one of the plurality of reference signal terminals.

8. The current steering folding circuit as defined in claim 1, wherein the at least one current source is a single current source.

9. The current steering folding circuit as defined in claim 1, wherein the at least one current source is a plurality of current sources.

10. The current steering folding circuit as defined in claim 1, wherein the load comprises a first load transistor and a second load transistor, wherein the first output signal comprises a first load transistor current through the first load transistor, and wherein the second output signal comprises a second load transistor current through the second load transistor.

11. The current steering folding circuit as defined in claim 1, wherein the current steering folding circuit is used to provide a folded output signal in an analog-to-digital converter.

12. The current steering folding circuit as defined in claim 11, wherein the folded output signal is proportional to the difference between the first output signal and the second output signal.

13. A current steering folding circuit, comprising:
    an input terminal for receiving an input signal;
    a plurality of reference signal terminals, wherein each reference signal terminal receives a different reference signal from a plurality of reference signals;
    a load;
    at least one current source for drawing a current from the load;
    a first output signal terminal for providing a first output signal;
    a second output signal terminal for providing a second output signal; and
    a current steering section for steering the current between the first output signal terminal and the second output signal terminal based on the input signal, wherein the first output signal is substantially equal to the second output signal for N values of the input signal that correspond to the plurality of reference signals, and wherein the number of current sources does not exceed N.

14. The current steering folding circuit as defined in claim 13, wherein the current steering section comprises a plurality of differential pairs.

15. The current steering folding circuit as defined in claim 14, wherein the plurality of differential pairs are serially connected.

16. The current steering folding circuit as defined in claim 14, wherein the number of differential pairs is equal to N.

17. The current steering folding circuit as defined in claim 14, wherein each differential pair comprises a first transistor and a second transistor, wherein the first transistor in each differential pair is coupled to the input terminal, and wherein the second transistor in each differential pair is coupled to one of the plurality of reference signal terminals.

18. The current steering folding circuit as defined in claim 13, wherein the at least one current source is a single current source.

19. The current steering folding circuit as defined in claim 13, wherein the at least one current source is a plurality of current sources.

20. The current steering folding circuit as defined in claim 13, wherein the load comprises a first load transistor and a second load transistor, wherein the first output signal comprises a first load transistor current through the first load transistor, and wherein the second output signal comprises a second load transistor current through the second load transistor.

21. The current steering folding circuit as defined in claim 13, wherein the current steering folding circuit is used to provide a folded output signal in an analog-to-digital converter.

22. The current steering folding circuit as defined in claim 21, wherein the folded output signal is proportional to the difference between the first output signal and the second output signal.

23. An analog-to-digital converter for converting an analog input signal into a digital output signal, comprising:
    a coarse quantizer for receiving the analog input signal and determining the most significant bits of the digital output signal;
    a fine quantizer for receiving a folded output signal and determining the least significant bits of the digital output signal; and
    a current steering folding circuit for receiving the analog input signal and generating the folded output signal, wherein the folding circuit comprises:
      an input terminal for receiving an input signal;
      a load;
      at least one current source for drawing a current from the load;
      a first output signal terminal for providing a first output signal;

a second output signal terminal for providing a second output signal; and a current steering section for steering the current between the first output signal terminal and the second output signal terminal based on the input signal, wherein the first output signal is substantially equal to the second output signal for N values of the input signal, wherein the folded output signal is proportional to the difference between the first output signal and the second output signal, and wherein the number of current sources does not exceed N.

24. The analog-to-digital converter as defined in claim 23, wherein the current steering folding circuit further comprises a plurality of reference signal terminals, wherein each reference signal terminal receives a different reference signal from a plurality of reference signals.

25. The analog-to-digital converter as defined in claim 24, wherein the N values of the input signal correspond to the plurality of reference signals.

26. The analog-to-digital converter as defined in claim 24, wherein the current steering section comprises a plurality of differential pairs.

27. The analog-to-digital converter as defined in claim 26, wherein the plurality of differential pairs are serially connected.

28. The analog-to-digital converter as defined in claim 26, wherein the number of differential pairs is equal to N.

29. The analog-to-digital converter as defined in claim 26, wherein each differential pair comprises a first transistor and a second transistor, wherein the first transistor in each differential pair is coupled to the input terminal, and wherein the second transistor in each differential pair is coupled to one of the plurality of reference signal terminals.

30. The analog-to-digital converter as defined in claim 23, wherein the at least one current source is a single current source.

31. The analog-to-digital converter as defined in claim 23, wherein the at least one current source is a plurality of current sources.

32. The analog-to-digital converter as defined in claim 23, wherein the load comprises a first load transistor and a second load transistor, wherein the first output signal comprises a first load transistor current through the first load transistor, and wherein the second output signal comprises a second load transistor current through the second load transistor.

33. A current steering folding circuit, comprising:
means for receiving an input signal;
a load;
at least one current source for drawing a current from the load;
a first output signal terminal for providing a first output signal;
a second output signal terminal for providing a second output signal; and
means for steering the current between the first output signal terminal and the second output signal terminal based on the input signal, wherein the first output signal is substantially equal to the second output signal for N values of the input signal, and wherein the number of current sources does not exceed N.

34. The current steering folding circuit as defined in claim 33, wherein the at least one current source is a single current source.

35. The current steering folding circuit as defined in claim 33, wherein the at least one current source is a plurality of current sources.

36. The current steering folding circuit as defined in claim 1, wherein the load comprises a first load transistor and a second load transistor, wherein the first output signal comprises a first load transistor current through the first load transistor, and wherein the second output signal comprises a second load transistor current through the second load transistor.

37. The current steering folding circuit as defined in claim 33, wherein the current steering folding circuit is used to provide a folded output signal in an analog-to-digital converter.

38. The current steering folding circuit as defined in claim 37, wherein the folded output signal is proportional to the difference between the first output signal and the second output signal.

* * * * *